(12) United States Patent
Sugimura et al.

(10) Patent No.: US 7,229,748 B2
(45) Date of Patent: Jun. 12, 2007

(54) METHOD FOR FORMING A MICRO PATTERN, MICRO PATTERN, METHOD FOR FABRICATING A MOLD FOR FORMING THE MICRO PATTERN THROUGH TRANSCRIPTION, AND MOLD FOR FORMING THE MICRO PATTERN THROUGH TRANSCRIPTION

(75) Inventors: Hiroyuki Sugimura, Nagoya (JP); Nagahiro Saito, Nagoya (JP); Osamu Takai, Nagoya (JP)

(73) Assignee: National University Corporation Nagoya University, Nagoya (JP)

( * ) Notice: Subject to any disclaimer, the term of this patent is extended or adjusted under 35 U.S.C. 154(b) by 113 days.

(21) Appl. No.: 10/901,078

(22) Filed: Jul. 29, 2004

(65) Prior Publication Data
US 2005/0058951 A1 Mar. 17, 2005

(30) Foreign Application Priority Data
Aug. 14, 2003 (JP) ............................. 2003-293411

(51) Int. Cl.
*G03C 5/00* (2006.01)

(52) U.S. Cl. ....................... 430/322; 430/324; 430/330
(58) Field of Classification Search .................... None
See application file for complete search history.

(56) References Cited

U.S. PATENT DOCUMENTS

| 5,358,604 | A | * | 10/1994 | Lin et al. | ....................... 216/17 |
| 2002/0171026 | A1 | * | 11/2002 | Kuroda | .................... 249/114.1 |
| 2005/0074898 | A1 | * | 4/2005 | Datwani et al. | ............ 436/180 |

OTHER PUBLICATIONS

Lingjie Guo et al.; "Nanoscale silicon field effect transistors fabricated using imprint lithography"; Appl Phys. Lett; vol. 71 (No. 13), Sep. 29, 1997 pp. 1881-1883.

* cited by examiner

*Primary Examiner*—John A. McPherson
*Assistant Examiner*—Daborah Chacko-Davis
(74) *Attorney, Agent, or Firm*—Oliff & Berridge PLC

(57) ABSTRACT

An organic monomolecular film is formed on a first substrate, and micro processed using photolithography technique to form an organic monomolecular film pattern. Then, a thin film is selectively grown on the organic monomolecular film pattern, and transcribed onto a second substrate to form a micro pattern made of the thin film on the second substrate.

23 Claims, 4 Drawing Sheets

METHOD FOR FORMING A MICRO PATTERN, MICRO PATTERN, METHOD FOR FABRICATING A MOLD FOR FORMING THE MICRO PATTERN THROUGH TRANSCRIPTION, AND MOLD FOR FORMING THE MICRO PATTERN THROUGH TRANSCRIPTION

BACKGROUND OF THE INVENTION

1. Field of the Invention

This invention relates to a method for forming a micro pattern and the same micro pattern. This invention also relates to a mold for forming the micro pattern through transcription and a method for fabricating the mold.

2. Description of the Related Art

In the formation of a micro pattern made of metallic material or the like on a substrate made of polymeric material, conventionally, photolithography technique has been employed. In the photolithography technique, a film made of metallic material is formed uniformly over the polymer substrate, and resist applying process, light exposing process via photomask, developing process, etching process and resist removing process are carried out successively for the metallic film, thereby to form the intended micro pattern.

However, the micro pattern forming method using the photolithography technique requires much cost because of the complicated processes, and has some difficulties forming the micro pattern in high density by a line space of 10 μm or below.

SUMMERY OF THE INVENTION

It is an object of the present invention to provide a new forming method wherein a high density micro pattern can be formed easily and at low cost.

In order to achieve the above-mentioned object, this invention relates to a method for forming a micro pattern, comprising the steps of:

forming an organic monomolecular film on a first substrate, micro processing the organic monomolecular film using photolithography technique to form an organic monomolecular film pattern, selectively growing a thin film on the organic monomolecular film pattern, and transcribing the thin film onto a second substrate to form a micro pattern made of the thin film on the second substrate.

This invention also relates to a method for fabricating a mold for forming a micro pattern through transcription, comprising the steps of:

forming an organic monomolecular film on a given substrate, and micro processing the organic monomolecular film using photolithography technique to form an organic monomolecular film pattern.

Moreover, this invention relates to a mold for forming a micro pattern through transcription, comprising:

a given substrate, and an organic monomolecular film pattern formed on the substrate.

In the present invention, the high density organic monomolecular film pattern is formed of the organic monomolecular film made on the substrate, and the thin film to function as the intended micro pattern is selectively grown on the organic monomolecular film pattern to form the mold, which is pressed against another substrate made of polymeric material or the like so that the thin film can be transcript on the substrate.

In other words, in the present invention, only four steps of forming the organic monomolecular film, patterning the organic monomolecular film, selectively growing the thin film and transcribing the thin film are required to complete the intended micro pattern. Moreover, the thin film can be formed more finely and in higher density as the organic monomolecular film is pattered in higher density. Therefore, the intended micro pattern can be also formed in higher density through transcription.

In this way, according to the present invention, the intended micro pattern can be formed easily and in high density.

BRIEF DESCRIPTION OF THE DRAWINGS

For better understanding of the present invention, reference is made to the attached drawings, wherein.

DESCRIPTION OF THE PREFERRED EMBODIMENTS

This invention will be described in detail with reference to the accompanying drawings.

Figure 1:
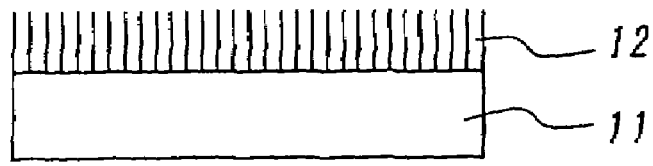
FIG. 1 is a first step in a forming method of micro pattern according to the present invention.

FIGS. 1–7 are process drawings in a fabricating method of micro pattern according to the present invention. First of all, as illustrated in FIG. 1, an organic monomolecular film 12 is formed on a first substrate 11. Any forming method can be applied to the formation of the organic monomolecular film 12, but preferably, the immersion in organic solvent for a predetermined period of the first substrate 11 can be applied. In this case, the organic monomolecular film 12 can be easily formed. As the organic solvent can be preferably employed undecanol.

In the immersion, the first substrate 11 can be immersed in the organic solvent, for example within several hours. The organic solvent may be heated to about 150° C. as occasion demands. Moreover, the organic solvent may be bubbled and degassed.

The first substrate 11 may be made of silicon or glass. Prior to the formation of the organic monomolecular film 12, the surface of the first substrate 11 may be pretreated and/or washed through etching using hydrofluoric acid.

Figure 2:
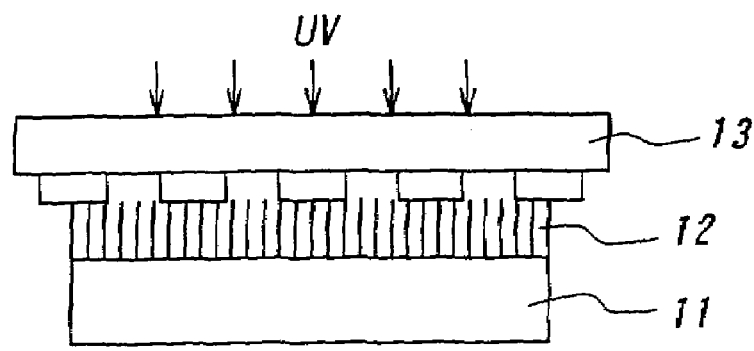
FIG. 2 is the next step after the first step illustrated in FIG. 1 in the forming method of micro pattern according to the present invention.
Figure 3:
FIG. 3 is the next step after the step illustrated in FIG. 2 in the forming method of micro pattern according to the present invention.

Then, as illustrated in FIG. 2, a photomask 13 is disposed above the organic monomolecular film 12, and vacuum ultraviolet laser beams preferably within a range of 200 nm or below, more preferably within a range of 140–180 nm are irradiated onto the organic monomolecular film pattern 14 from a not illustrated excimer laser source or the like via the photomask 13. In this case, since portions of the organic monomolecular film 12 to which the vacuum ultraviolet laser beams are irradiated are decomposed, the irradiated portions of the organic monomolecular film 12 can be washed and removed to form an organic monomolecular film pattern 14 as illustrated in FIG. 3. The assembly made of the first substrate 11 and the organic monomolecular film pattern 14 which is illustrated in FIG. 3 functions as a mold for forming the intended micro pattern according to the present invention through transcription.

Since the organic monomolecular film pattern 14 affects directly on the arrange density of the intended micro pattern, as will be described hereinafter, the line space, etc. of the organic monomolecular film pattern 14 can be determined on the line space, etc. of the intended micro pattern. Concretely, if the line space of the intended micro pattern is set to 10 μm or below, the line space of the organic monomolecular film pattern 14 is also set to 10 μm or below.

Figure 4:
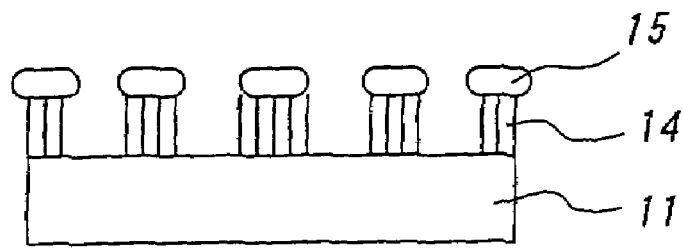
FIG. 4 is the next step after the step illustrated in FIG. 3 in the forming method of micro pattern according to the present invention.

Then, as illustrated in FIG. 4, a given thin film 15 is selectively grown on the organic monomolecular film pattern 14. The thin film 15 is made of metallic material, inorganic material or organic and inorganic composite material. Particularly, if the thin film 15 is made of metallic material and a second substrate which is to be described in detail hereinafter is made of polymeric material, a metallic micro pattern can be formed on the polymeric second substrate. According to the present invention, therefore, the metallic micro pattern can be formed easily on the polymeric substrate, which is concerned for a long time.

As the metallic material can be preferably exemplified Ni or Cu. Since the Ni thin film or the Cu thin film 15 can not be adhesive onto the organic monomolecular film pattern 14, the Ni thin film or the Cu thin film can be formed through transcription on the second substrate.

The selective growth of the metallic thin film 15 on the organic monomolecular film pattern 14 can be performed by means of plating such as electroless plating. In this case, the plating is performed directly onto the assembly illustrated in FIG. 3 (the assembly is immersed into a plating solution) without any mask to selectively grow the metallic thin film 15 on the organic monomolecular film pattern 14.

The metallic thin film 15 may be formed by means of other selective growth methods. For example, it may be that molecular beams or atomic beams are introduced in inclination onto the main surface of the first substrate 11 to selectively grow the metallic thin film 15 on the organic monomolecular film pattern 14.

Figure 5:
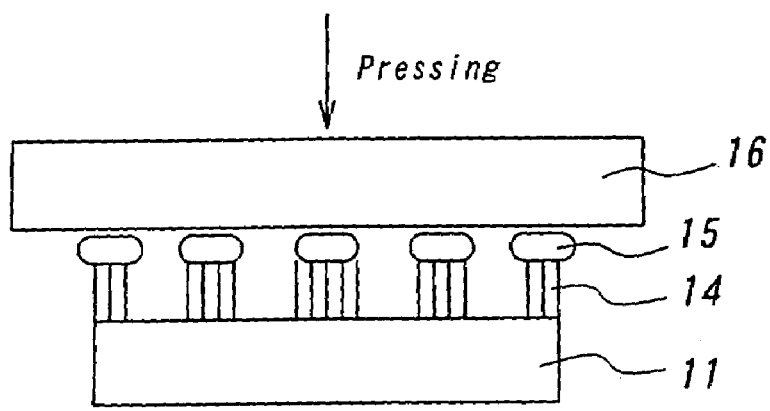
FIG. 5 is the next step after the step illustrated in FIG. 4 in the forming method of micro pattern according to the present invention.
Figure 6:
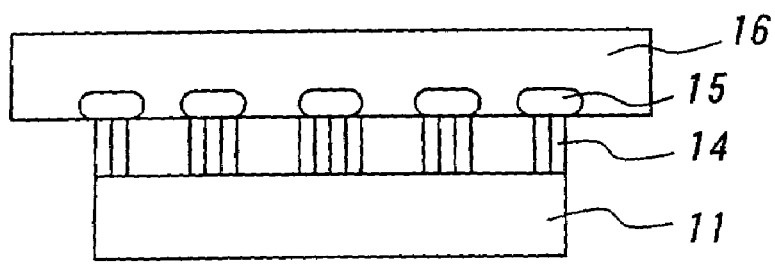
FIG. 6 is the next step after the step illustrated in FIG. 5 in the forming method of micro pattern according to the present invention.

Then, the second substrate 16 is prepared, and as illustrated in FIG. 5, is pressed against the thin film 15 formed on the first substrate 11. In this case, as illustrated in FIG. 6, the thin film 15 is transcribed on the second substrate 16, and then, the mold for transcription and formation made of the first substrate 11 and the organic monomolecular film pattern 14 is peeled off from the second substrate 16. As a result, as illustrated in FIG. 7, the intended micro pattern 17 made of the thin film 15 can be formed on the second substrate 16.

In the step illustrated in FIG. 5, the transcription is performed by the press of the second substrate 16 against the thin film 15, but any other transcription will do. For example, the main surface of the second substrate 16 may be processed so that the main surface can have anchor effect. In another aspect, an adhesive agent may be applied onto the main surface of the second substrate 16. In this case, if the second substrate 16 is only contacted with the thin film 15, the micro pattern 17 made of the thin film 15 can be transcribed on the second substrate 16.

Figure 7:
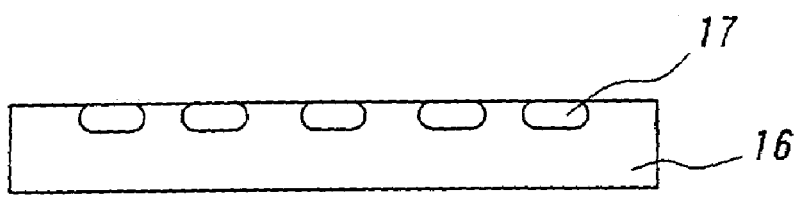
FIG. 7 is the next step after the step illustrated in FIG. 6 in the forming method of micro pattern according to the present invention.

In FIG. 7, although the micro pattern 17 is embedded into the second substrate 16, if the pressing stress and the material of the second substrate 16 are appropriately selected, the micro pattern 17 can be formed on and not embedded into the second substrate 16. However, if the second substrate 16 is made of polymeric material, the micro pattern 17 can be easily formed in the second substrate 16. In this case, since the micro pattern 17 is embedded in the second substrate 16, the adhesion of the micro pattern 17 to the second substrate 16 can be enhanced.

The pressing stress depends on the sorts of the thin film 15 and the second substrate 16, but preferably set to several ten MPa.

In the pressing of the second substrate 16, it is desired that the mold for transcription and formation made of the first substrate 11 and the organic monomolecular film pattern 14 is heated to a given temperature, for example to hundred and several ten ° C. In this case, the micro pattern 17 can be easily formed through transcription.

The transcription mold can be used repeatedly, and the thin film 15 is formed on the organic monomolecular film pattern 14 again, the micro pattern 17 can be formed repeatedly through transcription.

In the above-mentioned process, if the line space of the organic monomolecular film pattern 14 is controlled and thus, narrowed, the line space of the micro pattern 14 can be narrowed, for example to 10 μm or below. Therefore, the micro pattern 14 can be formed in high density.

Figure 8:
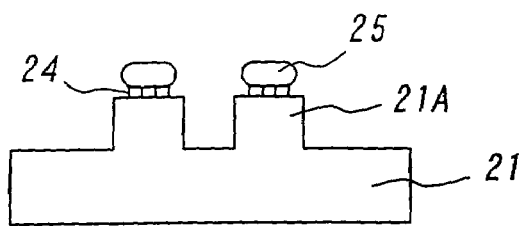
FIG. 8 is one step in a modified fabricating method of micro pattern according to the present invention.

FIGS. 8–11 are process drawings in a modified fabricating method of micro pattern according to the present invention. In this embodiment, instead of the plane first substrate 11 illustrated in FIG. 1, a concavo-convex first substrate 21 is used, wherein the surface of the substrate 21 is processed in concavity and convexity. In this embodiment, too, as illustrated in FIG. 8, an organic monomolecular film pattern 24 is formed on the convex portions 21A of the first substrate 21 in the same manner as the steps illustrated in FIGS. 1–4, and then, a thin film 25 is selectively grown on the organic monomolecular film pattern 24.

Figure 9:
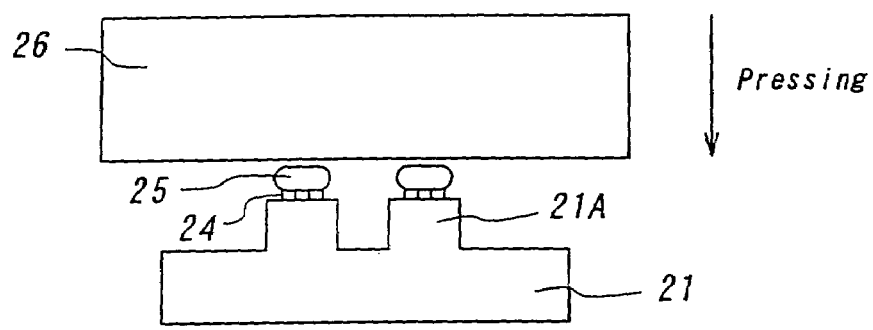
FIG. 9 is the next step after the step illustrated in FIG. 8 in the modified forming method of micro pattern according to the present invention.
Figure 10:
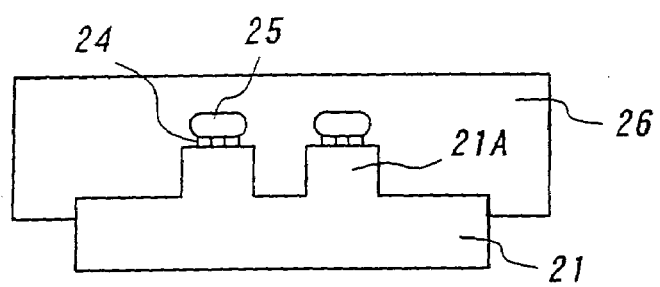
FIG. 10 is the next step after the step illustrated in FIG. 9 in the modified forming method of micro pattern according to the present invention.
Figure 11:
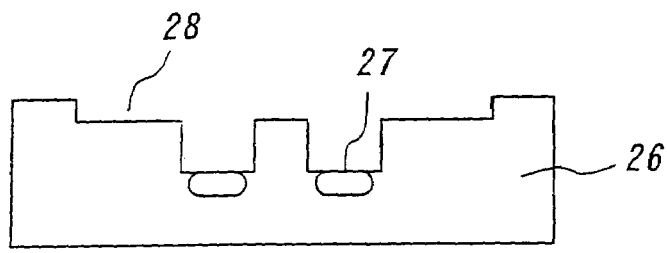
FIG. 11 is the next step after the step illustrated in FIG. 10 in the modified forming method of micro pattern according to the present invention.

Then, as illustrated in FIG. 9, a second substrate 26 is pressed against the thin film 25, as illustrated in FIG. 10, to transcribe the thin film 25 onto the second substrate 26 and press the convex portions 21A against the second substrate 26. Then, when the transcribing mold made of the first substrate 21 and the organic monomolecular film pattern 24 is peeled off from the second substrate 26, as illustrated in FIG. 11, the second substrate 26 is processed in concavity and convexity and the intended micro pattern 27 made of the thin film 25 is formed in the depressed portions 28 of the second substrate 26 through transcription.

In the forming method of micro pattern of the present invention, if the thin film 25, that is, the micro pattern 27 is made of metallic material, for example, a metallic wire or a metallic electrode can be preferably formed on a portion of a micro flow channel part.

EXAMPLE

A (111) faced p-type Si substrate was prepared, and etched in 5%-hydrofluoric acid for a three minutes to remove the surface oxidizing film, and immersed into an undecanol solution kept at 150° C. and degassed by means of nitrogen bubbling for five hours to form an organic monomolecular film. Then, an excimer lamp source was prepared, and ultraviolet beams were irradiated onto the organic monomolecular film from the excimer lamp source via a given photomask. In this case, the organic monomolecular film was partially decomposed and removed to form an organic monomolecular film pattern. Then, a Ni thin film was selectively grown on the organic monomolecular film pattern by means of electroless plating. In the electroless plating, an activator and an accelerant were utilized.

Figure 12:
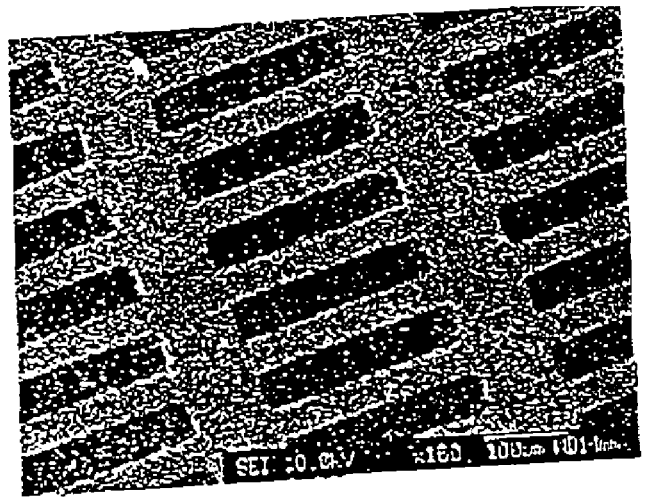
FIG. 12 is a SEM photograph showing the state of a Ni thin film selectively grown on an organic monomolecular film pattern.

FIG. 12 is a SEM photograph showing the state of the Ni thin film selectively grown on the organic monomolecular film pattern. As is apparent from FIG. 12, the Ni thin film is selectively grown commensurate with the pattern shape of the organic monomolecular film pattern.

Then, a polymer substrate made of PMMA (molecular weight: 25000, glass transition temperature: 105° C.) was pressed against the Ni thin film by a pressing stress of 10 MPa with a pressing machine while the transcribing mold made of the Si substrate with the Ni thin film and the organic monomolecular film pattern was heated to 180° C. Then, the pressing machine was released, and a Ni micro pattern was formed in the polymer substrate.

Figure 13:
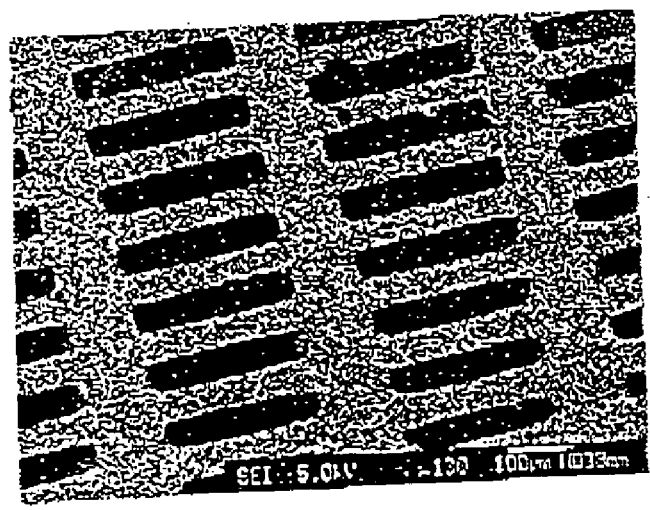
FIG. 13 is a SEM photograph showing a micro pattern according to the present invention.

FIG. 13 is a SEM photograph of the Ni micro pattern. As is apparent from FIG. 13, the Ni micro pattern was formed in the polymer substrate through transcription.

Although the present invention was described in detail with reference to the above examples, this invention is not limited to the above disclosure and every kind of variation and modification may be made without departing from the scope of the present invention.

The present invention can be utilized as manufacturing technique of printed wiring assembly for high density packaging, and applied to manufacturing parts of electronic instruments. Then, the present invention can be utilized as elementary technique of fabricating micro-chemical/biochemical analysis chips, and applied to fabricating parts of analytic chemical devices and medical diagnosing devices. Moreover, the present invention can be utilized as manufacturing technique of minute mechanical parts such as micro machines.

What is claimed is:

1. A method for forming a micro pattern, comprising the steps of:
    forming an organic monomolecular film on a first substrate,
    micro processing said organic monomolecular film using photolithography technique to form an organic monomolecular film pattern,
    selectively growing a thin film on said organic monomolecular film pattern, and
    transcribing said thin film onto a second substrate to form a micro pattern made of said thin film on said second substrate.

2. The forming method as defined in claim 1, wherein said organic monomolecular film is formed by immersing said first substrate in an organic solvent.

3. The forming method as defined in claim 2, wherein said organic solvent is undecanol.

4. The forming method as defined in claim 1, wherein said thin film is a metallic thin film, and said micro pattern is a metallic micro pattern.

5. The forming method as defined in claim 4, wherein said thin film is a Ni thin film or a Cu thin film, and said micro pattern is a Ni micro pattern or a Cu micro pattern.

6. The forming method as defined in claim 4, wherein said metallic thin film is formed by means of plating.

7. The forming method as defined in claim 1, wherein said first substrate with said thin film is heated, and said thin film is transcribed onto said second substrate by pressing said second substrate against said first substrate.

8. The forming method as defined in claim 7, wherein said first substrate has convex portions on a main surface thereof, and said thin film is transcribed onto said second substrate and said second substrate is processed in concavity and convexity by pressing said second substrate against said first substrate.

9. The forming method as defined in claim 8, wherein said organic monomolecular film pattern is formed on said convex portions of said first substrate.

10. The forming method as defined in claim 1, wherein said second substrate is a polymer substrate.

11. The forming method as defined in claim 10, wherein at least a portion of said micro pattern is embedded into said second substrate through transcription.

12. The forming method as defined in claim 1, wherein a line space of said micro pattern is 10 μm or below.

13. A method for fabricating a mold for forming a micro pattern through transcription, comprising the steps of:
    forming an organic monomolecular film on a given substrate, and
    micro processing said organic monomolecular film using photolithography technique to form an organic monomolecular film pattern, wherein a thin film is selectively grown and formed on said organic monomolecular film pattern so that said thin film can be transcribed onto another substrate, thereby forming a micro pattern made of said thin film on said another substrate.

14. The fabricating method as defined in claim 13, wherein said organic monomolecular film is formed by immersing said first substrate in an organic solvent.

15. The fabricating method as defined in claim 14, wherein said organic solvent is undecanol.

16. The fabricating method as defined in claim 13, wherein said substrate has convex portions on a main surface thereof.

17. The fabricating method as defined in claim 16, wherein said organic monomolecular film pattern is formed on said convex portions of said substrate.

18. The fabricating method as defined in claim 13, wherein a line space of said organic monomolecular film pattern is 10 μm or below.

19. A mold for forming a micro pattern through transcription formed by a fabricating method as defined in claim 13.

20. A mold for forming a micro pattern through transcription, comprising:
    a given substrate, and an organic monomolecular film pattern formed on said substrate, wherein a thin film is selectively grown and formed on said organic monomolecular film pattern so that said thin film can be transcribed onto another substrate, thereby forming a micro pattern made of said thin film on said another substrate.

21. The mold as defined in claim 20, wherein said substrate has convex portions on a main surface thereof.

22. The mold as defined in claim 21, wherein said organic monomolecular film pattern is formed on said convex portions of said substrate.

23. The mold as defined in claim 20, wherein a line space of said organic monomolecular film pattern is 10 μm or below.

* * * * *